United States Patent [19]

West et al.

[11] Patent Number: 4,814,294
[45] Date of Patent: Mar. 21, 1989

[54] METHOD OF GROWING COBALT SILICIDE FILMS BY CHEMICAL VAPOR DEPOSITION

[75] Inventors: Gary A. West, Dover; Karl W. Beeson, Princeton, both of N.J.

[73] Assignee: Allied-Signal Inc., Morris Township, Morris County, N.J.

[21] Appl. No.: 79,564

[22] Filed: Jul. 30, 1987

[51] Int. Cl.$^4$ ............................................. H01L 21/285
[52] U.S. Cl. ...................................... 437/200; 437/245; 437/184; 427/126.6
[58] Field of Search ............... 437/200, 201, 245, 246, 437/192, 193, 184; 427/69, 53.1, 54.1, 55, 64, 125, 126.1, 126.6

[56] References Cited

U.S. PATENT DOCUMENTS

| | | | |
|---|---|---|---|
| 4,324,854 | 4/1982 | Beauchamp et al. | 430/296 |
| 4,359,490 | 11/1982 | Lehror | 427/95 |
| 4,392,299 | 7/1983 | Shaw et al. | 437/200 |
| 4,451,503 | 5/1984 | Blum et al. | 427/53.1 |
| 4,543,270 | 9/1985 | Oprysko et al. | 427/53.1 |
| 4,555,301 | 11/1985 | Gribson et al. | 156/617 R |
| 4,568,565 | 2/1986 | Gupta et al. | 437/245 |
| 4,615,904 | 10/1986 | Ehrlich et al. | 427/38 |
| 4,617,237 | 10/1986 | Gupta et al. | 428/446 |
| 4,683,147 | 7/1987 | Eguceni et al. | 427/54.1 |

OTHER PUBLICATIONS

Gibson, J. M., et al, edited, Materials Research Society Symposia Proceeding, vol. 37, 1985, pp. 573-578.
Aylett, B. J., et al., Vacuum, vol. 35, Nos. 10-11, 1985, pp. 435-439.
Ehrlich, D. J., et al., J. ElectroChem. Soc., Sep. 1981, pp. 2039-2041.
Kaplan et al, J. Electrochem Soc., vol. 117, No. 5, May 1970, pp. 693-700.
Diem et al., Thin Solid Films, 107 (1983), pp. 39-43.
Vogt, J. Vac. Sci. Technol., 20(4), Apr. 1982, pp. 1336-1340.
Kottke et al., J. Appl. Phys., vol. 60, No. 8, 15 Oct. 1986, pp. 2835-2841.
Tung et al., Second International Symposium on Silicon Molecular Beam Epitaxy, Abstract #1725 MBE (1987).
Gupta et al., J. Appl. Phys., 58(9), Nov. 1, 1985, pp. 3573-3582.

*Primary Examiner*—Brian E. Hearn
*Assistant Examiner*—T. N. Quach
*Attorney, Agent, or Firm*—Anibal Jose Cortina; Gerhard H. Fuchs

[57] ABSTRACT

This invention relates to an improved method of depositing cobalt silicide films on a substrate by chemical vapor deposition at a temperature range of about 100°–400° C. By employing two separate precursors of, preferably, for cobalt, comprised of cobalt carbonyls having a vapor pressure sufficiently high to provide a cobalt stream to support chemical vapor deposition, and for silicon, comprised of silanes or halogenated silanes having a vapor pressure sufficient to support chemical vapor deposition, a cobalt silicide film is grown. The ratio of silicon to cobalt is controlled precisely by varying the substrate temperature while the process is being conducted. In a more specific aspect, the films are grown on substrates of either gallium arsenide or silicon. In the case of silicon, epitaxial growth of the cobalt silicide film is achieved by specific control of process parameters.

14 Claims, 3 Drawing Sheets

METHOD OF GROWING COBALT SILICIDE FILMS BY CHEMICAL VAPOR DEPOSITION

BACKGROUND OF THE INVENTION

This invention relates to a method of chemically vapor depositing cobalt silicide films. More particularly, the method relates to the chemical vapor deposition of cobalt silicide films in a manner wherein the ratio of cobalt to silicon can be precisely controlled.

Cobalt silicide is a metal with potentially large applications, for example, as a Schottky barrier gate metal, and specifically, on gallium arsenide devices (GaAs), and as a gate and/or contact metal for silicon integrated circuits. Further, cobalt silicide has a close lattice match, e.g., about 1.2 percent difference, to silicon which makes epitaxial growth of cobalt silicide on silicon possible. One potential application or such cobalt silicide epitaxy is a new type of transistor, generally known in the art as a semiconductor-metal-semiconductor transistor as well as epitaxial films for three-dimensional integrated circuits.

Up to now there has been no practical method for performing chemical vapor deposition of cobalt silicide as films, for example, on semiconductor devices. In such applications it is preferable that chemical vapor deposition be conducted because, for example, in the case of depositing thin films on GaAs, the traditional method of sputtering can result in extensive ion and UV photon damage to the GaAs surface as well as the introduction of trace impurities. Even on silicon devices where ion damage is not as extensive a problem, good CVD processing is preferred over sputtering because of the superior coverage achieved with CVD.

In the past, Schottky barriers have been used as gates in metal semiconductor field-effect transistors (MESFETs). In the case of devices that do not undergo high temperature processing, Al or Au can be used as the gate metal. Furthermore, for very small, high speed discrete or integrated GaAs devices, it is desirable to make what is called a self-aligned gate. The process to achieve this involves depositing a thin metal film and then patterning the film to form the gate metal structure. The gate metal becomes the master in a subsequent ion implant to form the source and drain regions. A problem with such a process however is that ion implantation causes damage to the GaAs which must be later removed by annealing at 850° C. for about 30 minutes. During the annealing step, the gate metal must not react or diffuse into the GaAs. Thus, Al, Au, or other non-refractory simple metals cannot be used because they are unstable on GaAs above about 500° C.

It is thus preferred that metal silicides be used because they are more stable than simple metals on GaAs. For example, tungsten silicide, molybdenum silicide and titanium silicide have been tried as metals for making self-aligned gates. It has been found that tungsten rich ($W_5Si_3$) tungsten silicide was stable on GaAs at 850° C. $W_5Si_3$ was thus one of the first metals found to be useful for ion-implanted self-aligned gates. On the other hand, $W_5Si_3$ is not a good solution however because it has, after annealing at 850° C., a relatively high resistivity of about 200 micro ohms-cm which is about two orders of magnitude higher than gold. As a result, the high resistivity can result in reduced device speeds.

It has been proposed that cobalt silicide or nickel silicide be tried for self-aligned gates on GaAs. From thermodynamic considerations, it has been calculated that cobalt silicide or nickel silicide should be thermally stable on GaAs. Further, initial experiments using cobalt silicide appear to confirm this prediction. Still further, cobalt silicide, e.g., $CoSi_2$ in particular, has a lower resistivity than $W_5Si_3$.

In the past the problem with depositing cobalt silicide has been that up to now no effective method of depositing cobalt silicide by chemical vapor deposition, in a manner wherein the ratio of cobalt to silicon can be precisely controlled, has been achieved. For example, in "Chemical Vapour Deposition of Transition-Metal Silicides By Pyrolsis of Silyl Transition-Metal Carbonyl Compounds", J. C. S. Dalton, page 2058, March 31, 1977, Aylett and Colquhoun purpose chemically vapor depositing cobalt silicide from a single precursor comprised of [$Co(CO)_4(SiH_3)$] to result in a cobalt silicide film. The problem with using this single precursor is that the ratio of cobalt to silicon cannot be precisely controlled and thus, the resultant film has a composition that makes it effectively useless for the specific applications contemplated herein.

Accordingly, the invention avoids the aforementioned problems and provides an effective method of chemically vapor depositing cobalt silicide films in a controllable manner wherein the ratio of cobalt to silicon can be easily controlled.

SUMMARY OF THE INVENTION

In one aspect, the invention relates to an improvement in a method of depositing a cobalt silicide film on a substrate by chemical vapor deposition. The typical environment wherein the improvement is practiced involves supplying cobalt from a cobalt precursor vapor and silicon from a silicon precursor vapor to a chemical vapor deposition chamber containing a substrate therein to cause a cobalt silicide film to be deposited on the substrate.

The improvement resides in that the chemical vapor deposition is conducted with a cobalt precursor selected from the group comprised of carbonyls having a vapor pressure sufficiently high to provide a cobalt containing stream sufficient to support chemical vapor deposition, and with a silicon precursor selected from the group comprised of silanes or halogenated silanes, and having a vapor pressure sufficient to provide a silicon containing stream sufficient to support chemical vapor deposition.

In a more specific aspect, the cobalt precursor is one of $Co_2(CO)_8$, $HCo(CO)_4$, $Co_4(CO)_{12}$, $Co(CO)_3(NO)$, $(PF_3)Co(CO)_3$, [(triphenyl phosphine) $Co(CO)_3$], i.e., $(CH_6H_5)_3PCo(CO)_3$, and $RCo(CO)_3$ wherein R is $C_xH_{(2x+1)}$, and the silicon precursor is $SiH_4$, $Si_2H_6$, $Si_3H_8$, $SiF_4$, $SiH_3F$, $SiHF_3$, $SiCl_4$, $SiH_3Cl$, $SiH_2Cl_2$, $SiHCl_3$, $SiBr_4$, $SiH_3Br$, $SiH_2Br_2$, $SiHBr_3$, $SiCl_3Br$, $SiCl_2Br_2$, $SiClBr_3$, $SiI_4$ and $SiH_3I$. More preferably, the cobalt precursor is one of $Co_2(CO)_8$, $HCo(CO)_4$ and $Co(NO)(CO)_3$ and the silicon precursor is one of $SiH_4$, $Si_2H_6$ and $Si_3H_8$. In order to control the form of cobalt silicide deposited, i.e., $CoSi$ or $CoSi_2$, the substrate is heated to a temperature in the range of about 100°–400° C. In still more specific aspect, the substrate is one of GaAs or silicon, preferably in the form of a device.

BRIEF DESCRIPTION OF THE DRAWINGS

Having briefly described some aspects of the invention, the same will become better understood from the following detailed description made with reference to the Figures wherein.

DETAILED DISCUSSION OF THE INVENTION

Figure 1:
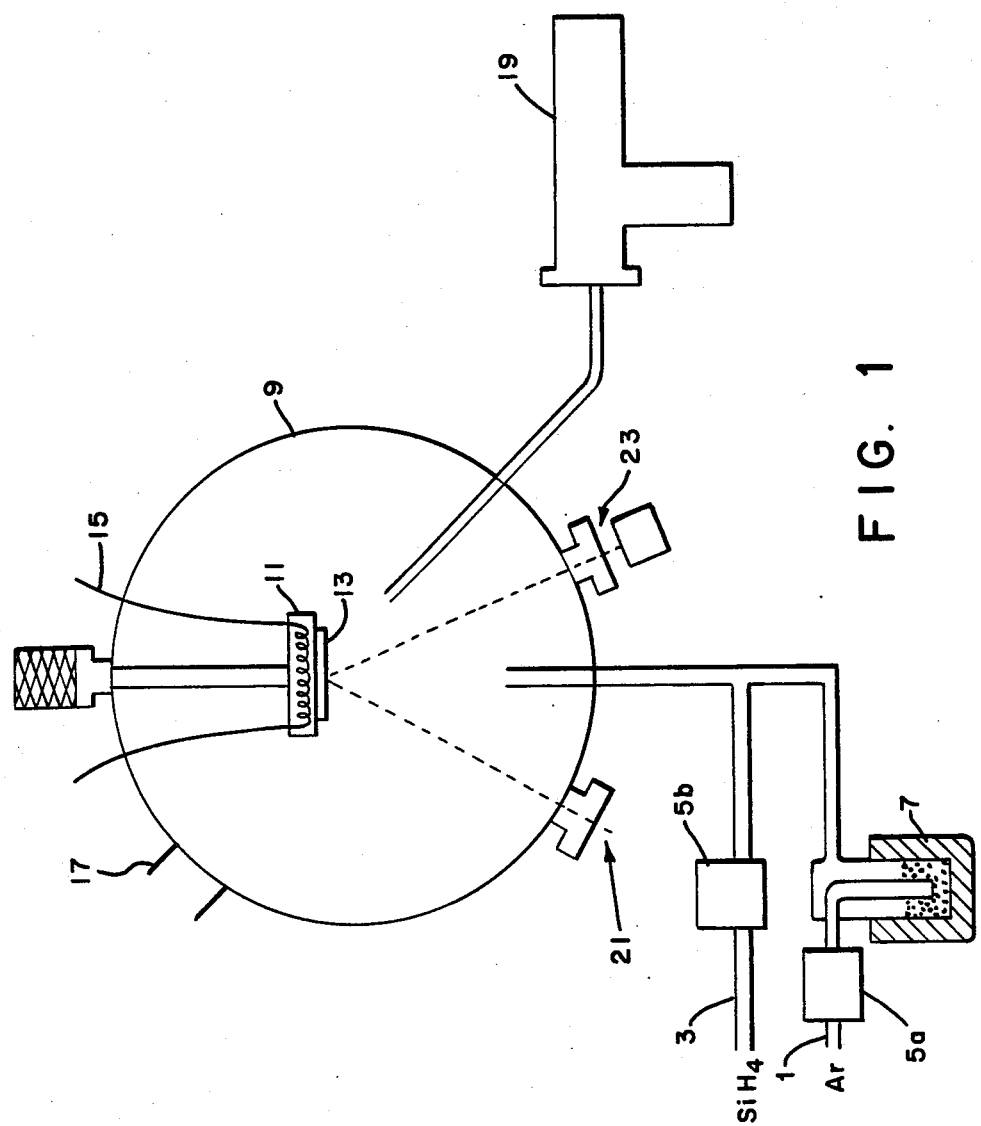
FIG. 1 schematically illustrates a typical chemical vapor deposition apparatus employed for conducting the method according to the invention.

In the practice of the invention, a conventional chemical vapor deposition system is employed for example, as illustrated in FIG. 1. More specifically, such a system typically comprises a chamber 9 for chemically vapor depositing a film on a substrate 13. Such a substrate 13 is typically supported on a substrate support 11 which is associated with a substrate heater 15 for the purpose of heating the substrate 13 to a desired temperature. A vacuum outlet 17 leads to a vacuum pump which serve to withdraw air or other gases which are undesired from the chamber 9. A gas analyzer 19, typically a Quadrupole Mass Spectrometer with a Turbomolecular Pump associated therewith, serves to analyze and monitor the reactant and product gas composition being fed into the chamber 9 for conducting chemical vapor deposition. Typically, a detector system such as a laser 21 emitting a laser beam, i.e. HeNe laser beam and offset photodiode detector 23 serve to measure and monitor film deposition by the substrate reflectivity.

A first source feedline 3 of, in the case of this invention, silane, i.e., a silicon precursor, feeds into the chamber 9. A mass flow controller 5b serves to control the flow of the gaseous silicon precursor, e.g., silane through the line 3. Likewise, a separate inert gas source, in this case Argon, feeds through line 1 into a chamber containing a cobalt precursor, e.g., cobalt carbonyl. Mass flow controller 5a controls the gaseous cobalt precursor flow into chamber 9. An Argon carrier gas flows through the cobalt carbonyl, where vapor pressure is controlled by a temperature controller 7 which maintains the cobalt carbonyl in a temperature range of about room temperature to 70° C., and carries cobalt into the chamber 9 wherein it reacts with the silicon supplied by the silicon source through line 3 to form a cobalt silicide film on the heated substrate 13.

In another embodiment of the invention, a scanning focused laser beam can be used to locally heat small regions of the sample to selectively deposit cobalt silicide only in the selected areas. In this case, a general full surface substrate heater 15 is not used.

Although Argon has been indicated as the preferred carrier gas, as will be readily apparent to those of ordinary skill in the art other inert gasses such as Nitrogen, Helium, Xenon and the like can be employed. The primary considerations in selection is the unreactivity of the gas with the reactants and the costs of the gas selected as the gas employed. Further, as will be readily apparent to those of ordinary skill in the art, the chemical vapor deposition apparatus can be modified in a manner which is conventional and well known to those of ordinary skill in this art.

As noted previously, in accordance with the invention cobalt silicide chemical vapor deposition is conducted using, preferably, the reactants of dicobalt octacarbonyl, i.e., $[Co_2(CO)_8]$ and silane or disilane, i.e., $(SiH_4)$ or $(Si_2H_6)$. The films are deposited on a heated substrate mounted in a low-pressure CVD reactor. Dicobalt octocarbonyl is a solid at room temperature with a vapor pressure of about 0.06 torr. In order to conduct the CVD, dicobalt octocarbonyl powder is placed in a reservoir whose temperature is precisely controlled, for example, in a large between room temperature and $-70°$ C. Argon gas is flowed over the powder and acts as a carrier gas to transport the $[Co_2(CO)_8]$ vapor into the CVD chamber.

Preferably, the substrate temperature is maintained in the range of about 100°–400° C. A lower temperature is possible, as will be readily apparent hereinafter, but the film quality will not be as good. The preferred temperature for, for example, silicon and GaAs substrate applications is about 300° C. using the silane precursor and 200° C. using the disilane precursor. After 30 minutes of conducting chemical vapor deposition, a film approximately 0.5 micron thick is achieved and with a resistivity of about 400 microohms-cm. Auger analysis of such a film tyically indicates a composition of $CoSi_{2.2}$ with substantially no carbon detected in the film and with oxygen contamination of less than 5%. With respect to the temperature of 300° C., it is noted that such a temperature is acceptable for the purpose of depositing metal films on GaAs. Substantially, higher temperatures are unacceptable because of deterioration of the GaAs. Moreover, the temperature is ideal for preventing carbon and oxygen contamination.

Figure 3:
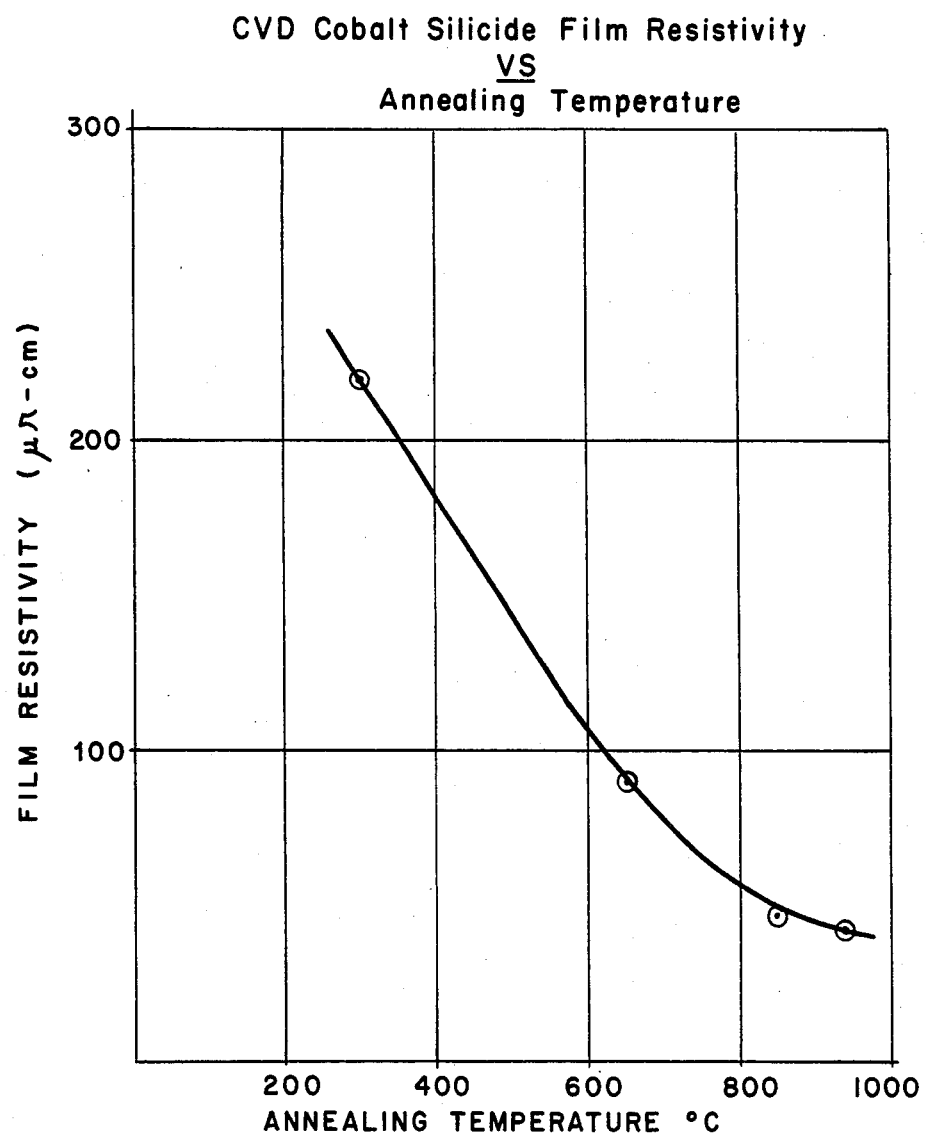
FIG. 3 indicates the resistivities obtained with increasing annealing temperatures.

The films are amorphous or microcrystalline as deposited with a resistivity of about $400\mu$ $\Omega$-cm. The films may be annealed to convert them to a polycrystalline form to obtain a low resistivity value. FIG. 3 indicates the resistivities obtained with increasing annealing temperatures.

Figure 2:
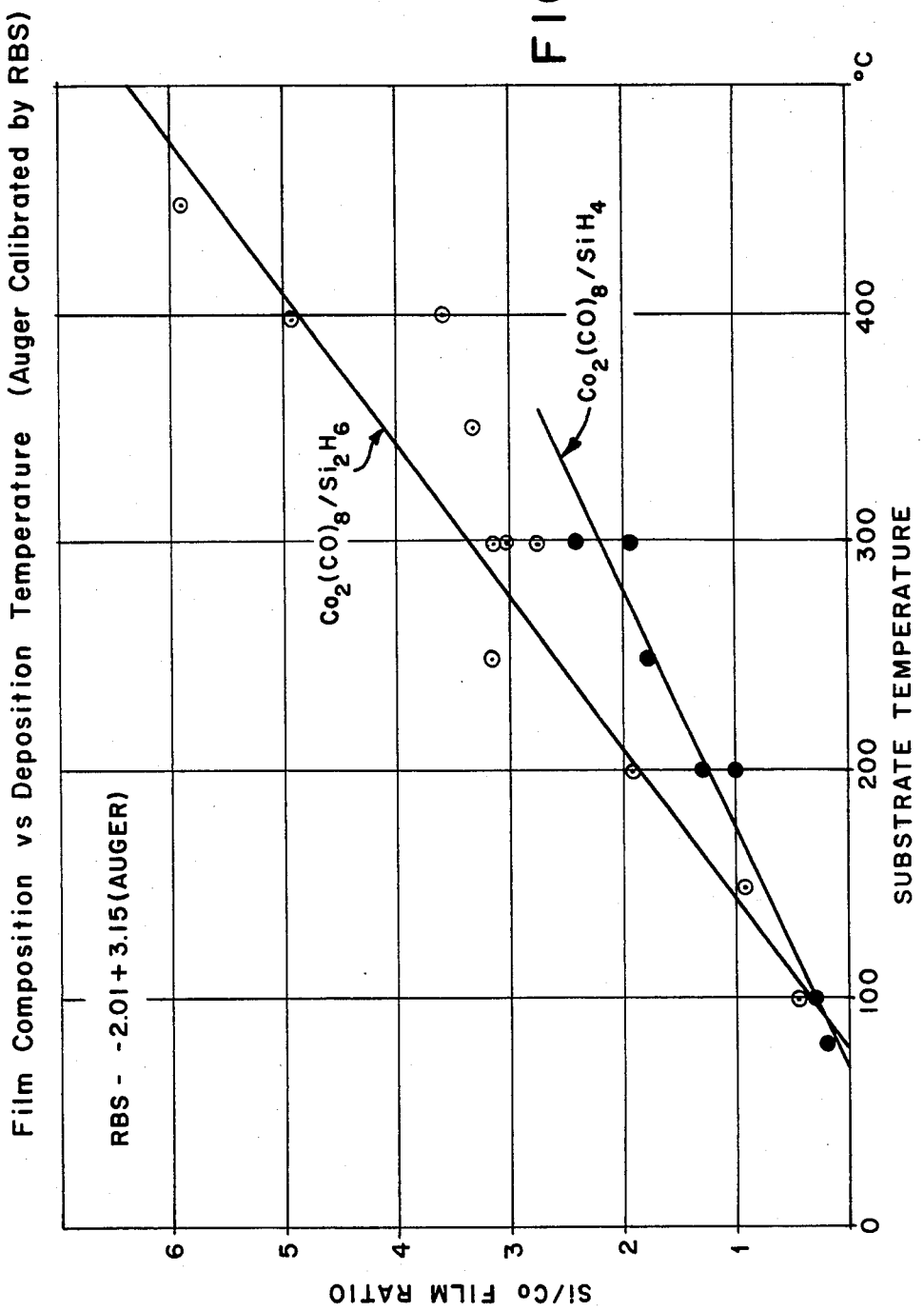
FIG. 2 is a graph illustrating how deposited film composition changes as a function of deposition temperature at which the substrate is heated.

In contrast, it is noted that metal carbonyls such as $W(CO)_6$ or $Mo(CO)_6$ are notorious for depositing films containing large amounts of carbon and oxygen. The effects of temperature as affecting the Si/Co film ratio in the method of the invention is shown on the attached FIG. 2 with two different precursor pairs used respectively for conducting the process. Although it has been indicated that the preferred precursor for conducting the chemical vapor deposition for cobalt is cobalt octocarbonyl as indicated in the chart, it is noted that the source of silicon can be either silane or disilane in its most preferred form. The graph of FIG. 2 shows results of experiments specifically conducted. Other sources of cobalt include $HCo(CO)_4$, $Co_4(CO)_{12}$, $Co(CO)_3(NO)$, $(PF_3)Co(CO)_3$, [(triphenyl phosphine) $Co(CO)_3$], and $RCo(CO)_3$ wherein R is $C_xH_{(2x+1)}$. Likewise, other sources of silicon include $Si_3H_8$, $SiF_4$, $SiH_3F$, $SiH_3F$, $SiHF_3$, $SiCl_4$, $SiH_3Cl$, $SiH_2Cl_2$, $SiHCl_3$, $SiBr_4$, $SiH_3Br$, $SiH_2Br_2$, $SiHBr_3$, $SiCl_3Br$, $SiCl_2Br_2$, $SiClBr_3$, $SiI_4$ an $SiH_3I$.

In yet still another more specific aspect of the invention, the process is employed to grow an epitaxial cobalt silicide film on silicon. In this case, as readily apparent to those of ordinary skill in the art, the substrate is silicon, preferably in the (111) orientation.

Using cobalt octocarbonyl and either silane or disilane, the silicon substrate is first prepared by standard wet cleaning and chemical procedures. After the initial standard wet cleaning and chemical procedures a rinse is conducted, for example, with dilute 2% HF solution. The resulting fluorinated silicon surface reduces oxide regrowth while the substrate is being introduced into the CVD reactor and permits oxide removal at lower substrate temperatures of up to 400° C. which are readily achievable in CVD apparatuses. A film is thus grown in accordance with the invention for 30 minutes with the substrate heated to 400° C.

The resultant film, after inspection by x-ray diffraction, is oriented with the silicon substrate, i.e., the (111) planes of the silicide and silicon substrate are parallel. Furthermore, electron diffraction indicates that the silicide is a single crystal material of $CoSi_2$. This is strong evidence that the resultant growth is expitaxial growth.

EXAMPLE I

A substrate of $1'' \times 1''$ $Al_2O_3$ was placed in a cold wall CVD reactor. $[Co_2(CO)_8]$ was placed in a reservoir connected to the CVD reactor. Argon gas was fed through the reservoir to entrain and supply cobalt to the CVD reactor. Likewise, silane was also fed to the reactor. While argon was passed through the $Co_2(CO)_8$ reservoir, the reservoir was immersed in a thermoelectronic cooler bath of 50% $H_2O$ ethylene glycol maintained at 6°–7° C. The flow of argon was 10.0 sccm. The flow of $SiH_4$ was 1.0 sccm. The partial pressure of the $[Co_2(CO)_8]$ in the reservoir was 0.01 torr. The partial pressure in the CVD reactor was 1.0 torr. The substrate temperature was raised while gases were flowing and then maintained at 80° C. Deposition began at about 55° C. Deposition was conducted for about 54 minutes. Probe measurements conducted at different areas of this film reveals the following thicknesses and resistivities.

|    | Thickness | Resistivity |
|----|-----------|-------------|
| 1. | 0.17 μm   | 24,000 μΩ-cm |
| 2. | 0.20 μm   | 45,000 μΩ-cm |
| 3. | 0.14 μm   | 65,000 μΩ-cm |
| 4. | 0.17 μm   | 75,000 μΩ-cm |
| 5. | 0.20 μm   | 43,000 μΩ-cm |
| 6. | 0.14 μm   | 60,000 μΩ-cm |

EXAMPLE II

The same as in Example I except the substrate was heated to 300° C. and deposition was conducted for 30 minutes. The resultant films were amorphous with a Co to Si ratio equal to $CoSi_2O$. The deposited film had the following characteristics.

|    | Thickness | Resistivity |
|----|-----------|-------------|
| 1. | 0.60 μm   | 380 μΩ-cm |
| 2. | 0.43 μm   | 390 μΩ-cm |
| 3. | 0.35 μm   | 400 μΩ-cm |
| 4. | 0.60 μm   | 350 μΩ-cm |
| 5. | 0.43 μm   | 390 μΩ-cm |
| 6. | 0.35 μm   | 400 μΩ-cm |

EXAMPLE III

The same as in Example I except the substrate was heated to 200° C. and disilane was used instead of silane. The resultant film was amorphous with a Co to Si ratio equal to $CoSi_{2.0}$. The deposited film had the following characteristics:

|    | Thickness | Resistivity |
|----|-----------|-------------|
| 1. | 0.25 μm   | 2200 μΩ-cm |
| 2. | 0.14 μm   | 1800 μΩ-cm |
| 3. | 0.12 μm   | 2100 μΩ-cm |

EXAMPLE IV

Films deposited under conditions described in examples II and III were annealed in an atmosphere of high purity argon for 30 minutes at 800° C. The film resistivity decreased from an average of 380μ Ω-cm to 40μ Ω-cm for a film of example II and from an average of 2000μ Ω-cm to 40μ Ω-cm for a film of Example III.

EXAMPLE V

The same as in Example I except the substrate was heated to 200° C. The resultant Co to Si film ratio was equal to $CoSi_{1.0}$.

EXAMPLE VI

Additional experiments were conducted as above with different precursors and temperatures. The results are summarized in FIG. 2.

EXAMPLE VII

A $1'' \times 1''$ single crystal silicon wafer having (111) orientation was cleaned by standard wet cleaning. Thereafter a wash with dilute (2%) HF solution was conducted. The resulting fluorinated silicon surface reduced oxide regrowth as the substrate was introduced into the CVD reactor of the above examples. Cobalt and silicon were introduced into the CVD reactor as in Example I but the substrate was heated to 400° C. The resultant film was analyzed by x-ray diffraction. Analysis showed that the film was crystalline and was oriented with the silicon substrate, i.e., the (111) planes of the silicide and silicon substrate were parallel. Electron diffraction analysis indicated the cobalt silicide was a $CoSi_2$ single crystal. This was strong evidence the growth was epitaxial.

Having generally described the invention the same is defined in the attached claims which are intended to be non-limiting.

What is claimed is:

1. In a method of depositing a cobalt silicide film on a substrate by chemical vapor deposition, the method comprising the steps of supplying cobalt containing vapor and silicon containing vapor from a cobalt and silicon precursor to a chemical vapor deposition chamber containing a substrate therein to cause a cobalt silicide film to be deposited on said substrate, the improvement wherein said chemical vapor deposition is conducted with a cobalt precursor selected from the group comprised of cobalt carbonyls having a vapor pressure sufficiently high to provide a sufficient cobalt stream to support chemical vapor deposition, and with a silicon precursor separate from said cobalt precursor and selected from the group comprised of halogenated silanes and having a vapor pressure sufficient to provide a silicon stream sufficient to support chemical vapor deposition, and said method being conducted at a temperature range of about 100° to 400° C.

2. A method as in claim 1 wherein said cobalt precursor is one of $[Co_2(CO)_8]$, $HCo(CO)_4$, $Co_4(CO)_{12}$, $Co(CO)_3(NO)$, $(PF_3)Co(CO)_3$, $[(triphenyl\ phosphine)\ Co(CO)_3]$, and $RCo(CO)_3$ wherein R is $C_xH_{(2x+1)}$.

3. A method as in claim 1 wherein said silicon precursor is one of $SiH_4$, $Si_2H_6$, $Si_3H_8$, $SiH_3F$, $SiHF_3$, $SiCl_4$, $SiH_3Cl$, $SiH_2Cl_2$, $SiHCl_3$, $SiBr_4$, $SiH_3Br$, $SiH_2Br_2$, $SiHBr_3$, $SiCl_3Br$, $SiCl_2Br_2$, $SiClBr_3$, $SiI_4$ and $SiH_3I$.

4. A method as in claim 1 wherein said cobalt precursor is one of $[Co_2(CO)_8]$, $HCo(CO)_4$ and $Co(NO)(CO)_3$, and said silicon precursor is one of $SiH_4$, $Si_2H_6$ and $Si_3H_8$.

5. A method as in claim 1 wherein said deposition is conducted by heating said substrate to said temperature range.

6. A method as in claim 5 wherein said cobalt precursor is $[Co_2(CO)_8]$ and said silicon precursor is $(SiH_4)$, and wherein said cobalt silicide chemical vapor deposition is conducted at a $Co_2(CO)_8$ vapor pressure of about 0.06 torr, and with the substrate heated to about 300° C. for about 30 minutes to deposit a film having a composition of $CoSi_{2.0}$.

7. A method as in claim 5 wherein said cobalt precursor is $Co_2(CO)_8$ and said silicon precursor is $(SiH_4)$ or $(Si_2H_6)$, and wherein said cobalt silicide chemical vapor deposition is conducted at a $Co_2(CO)_8$ vapor pressure of about 0.06 torr.

8. A method as in claim 6 wherein said substrate is of GaAs.

9. A method as in claim 6 wherein said substrate is of silicon.

10. A method as in claim 7 wherein said substrate is of silicon.

11. A method as in claim 10 further comprising, prior to chemically vapor depositing said film, cleaning said silicon wafer of oxide on the surface thereof by wet washing followed by rinsing with HF solution, to inhibit oxide regroth, thereafter conducting said deposition with the substrate heated to about 400° C. thereby resulting in an epitaxially grown layer of $CoSi_2$ on said silicon substrate which is oriented therewith with respect to the silicon wafer crystallinity.

12. A method as in claim 1 comprising controlling the ratio of cobalt to silicon in the cobalt silicide film growth by varying the temperature of the substrate on which the film is being grown in a predetermined manner.

13. A method as in claim 12 wherein said substrate is heated with a laser in a predetermined pattern to achieve deposition only in preselected areas.

14. A method as in claim 1 wherein said silicon precursor is comprised of disilanes.

* * * * *

UNITED STATES PATENT AND TRADEMARK OFFICE
CERTIFICATE OF CORRECTION

PATENT NO.  : 4,814,294
DATED       : March 21, 1989
INVENTOR(S) : G.A. West et al.

It is certified that error appears in the above-identified patent and that said Letters Patent is hereby corrected as shown below:

Col. 1, line 18:   "or" should read -- for --.

Col. 5, line 46:   "$CoSi_2O$" should read -- $CoSi_{2.0}$ --.

Col. 7, line 2:    After "$Si_3H_8$," insert -- $SiF_4$ --.

Col. 8, line 11:   "regroth" should read -- regrowth --.

line 18:   "growth" should read -- grown --.

Signed and Sealed this

Fourteenth Day of November, 1989

Attest:

JEFFREY M. SAMUELS

Attesting Officer     Acting Commissioner of Patents and Trademarks